United States Patent [19]

Hara et al.

[11] Patent Number: 4,985,685
[45] Date of Patent: Jan. 15, 1991

[54] DETECTOR CIRCUIT INCLUDING CURRENT ATTENUATING CIRCUIT AND CAPACITOR

[75] Inventors: Kenji Hara; Yoshio Wada, both of Yokohama, Japan

[73] Assignee: Kabushiki Kaisha Toshiba, Japan

[21] Appl. No.: 442,308

[22] Filed: Nov. 28, 1989

[30] Foreign Application Priority Data

Nov. 28, 1988 [JP] Japan .................................. 63-300021

[51] Int. Cl.⁵ .............................................. H03D 1/00
[52] U.S. Cl. ..................................... 329/349; 329/362; 329/369
[58] Field of Search ........................ 329/349, 362, 369

[56] References Cited

FOREIGN PATENT DOCUMENTS 2080644 2/1982 United Kingdom ................ 329/362

Primary Examiner—Robert J. Pascal
Attorney, Agent, or Firm—Banner, Birch, McKie & Beckett

[57] ABSTRACT

A detector circuit comprises demodulating means for demodulating an input signal in accordance with a carrier wave applied to the demodulating means, current attenuating means coupled with the demodulating means and for attenuating a signal from the demodulating means while keeping the information contained in the signal intact, and capacitor means, coupled with the output of the current attenuating means, for smoothing a waveform of an output signal of the current attenuating means.

12 Claims, 2 Drawing Sheets

DETECTOR CIRCUIT INCLUDING CURRENT ATTENUATING CIRCUIT AND CAPACITOR

BACKGROUND OF THE INVENTION

1. Field of the Invention

The present invention relates to a signal processing circuit for processing a television signal, for example, and more particularly to an APC filter for a killer detector contained in an IC chip.

2. Description of the Related Art

A detector circuit of a TV signal processing circuit, by convention, is realized by a circuit arrangement as shown in FIG. 2. In the circuit arrangement, a transmission conductance of a demodulator consisting of transistors 1 to 6, and current sources 7 and 8, and a capacitance of a capacitor 9, cooperate to determine a time constant of a filter circuit. In a conventional detector circuit based on the above circuit arrangement, to increase a time constant, a smoothing capacitor of a large capacitance is externally coupled with the chip. In another conventional detector circuit of the type in which the capacitor 9 is contained in the IC chip, an output current of the current source 8, which feeds an operating current of the demodulator, is made small by reducing an output current of the current source 8, which feeds an operating current of the demodulator.

Thus, in the conventional IC circuit, to increase a time constant of the filter circuit, the large capacitance capacitor 9 must be externally coupled with the IC chip. The reason for this is that the capacitor of a large capacitance cannot be fabricated into the IC chip. Therefore, the number of externally coupled components is increased.

In the approach in which the capacitor 9 of a small capacitance is contained in the IC chip, to obtain a desired filter time constant, an output of the current source 8 must be set to an extremely small value. This results in a degradation of a frequency characteristic of the demodulator.

SUMMARY OF THE INVENTION

Accordingly, an object of the present invention is to provide a detector circuit which successfully solves the problems of the prior circuits, by additionally using a current attenuating circuit In the present invention, as shown in FIG. 1, a current attenuating circuit including transistors 21, 22, and 29 to 32 is inserted between a demodulator made up of transistors 23 to 28, and a smoothing capacitor 40. Alternatively, a bias circuit made up of transistors 33 to 36 may be coupled with the collectors of the transistors 30 and 32. Use of the bias circuit stabilizes the operation of the detector circuit.

To realize a detector circuit having a desired filter time constant without increasing the capacitance of the smoothing capacitor 40 and without reducing the operating current of the demodulator, factors to determine the filter time constant must carefully be studied.

Generally, a time constant of the filter circuit is expressed by the product of a reciprocal of a mutual conductance gm of the circuit and a capacitance C, $T=C/gm$. On the basis of this fact, in the present invention, the current attenuating circuit, which attenuates only the current I from the demodulator made up of the transistors 23 to 28 while keeping the information contained in the current intact, is inserted between the demodulator and the smoothing capacitor. Reduction of the mutual conductance by this circuit allows a capacitance of the smoothing capacitor 40 to be small, because of the relation $T=C/gm$. Accordingly, a desired filter time constant can be obtained even if the smoothing capacitor of a small capacitance is used.

With such an arrangement, a desired time constant of the filter in the detector circuit can be obtained free from the degradation of the frequency characteristic due to the reduced operation current of the demodulator, and without external connection of the smoothing capacitor.

DETAILED DESCRIPTION OF THE PREFERRED EMBODIMENTS

Figure 1:
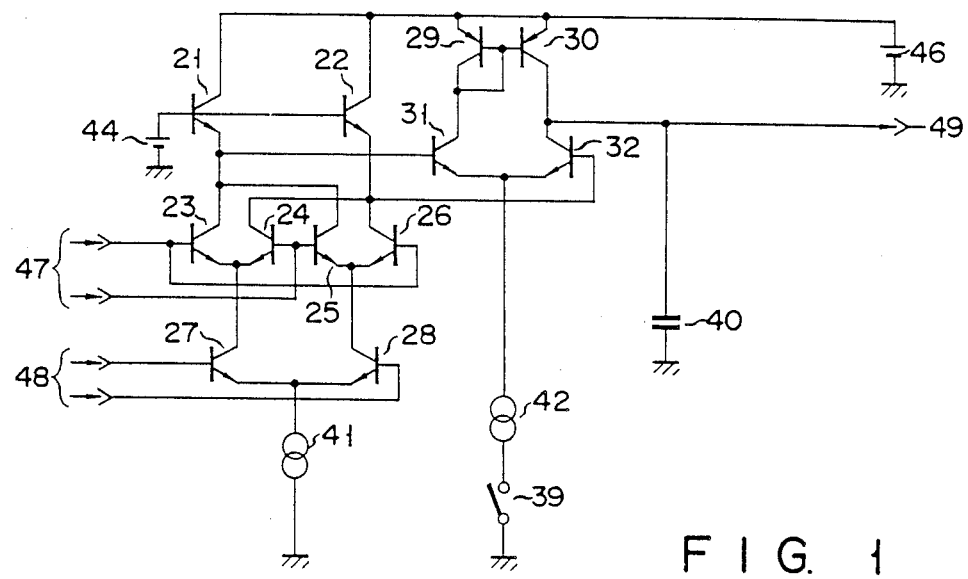
FIG. 1 is a circuit diagram of a detector circuit incorporating the present invention.
Figure 2:
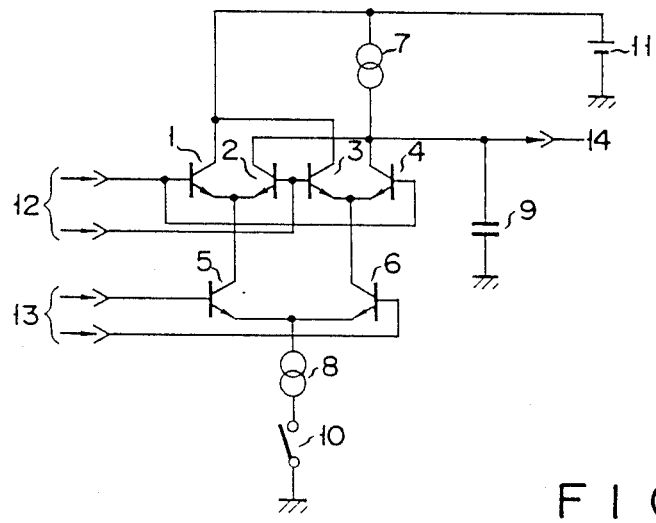
FIG. 2 is a circuit diagram of a detector circuit not incorporating the present invention.

An embodiment of the present invention is shown in FIG. 1. A signal to be demodulated is applied to the bases of the transistors 27 and 28. A carrier signal is applied to the bases of the transistors 23 to 26. The transistors 23 to 28 make up a demodulator, and its operating current is fed from a current source 41.

The transistors 21 and 22 whose bias voltage is applied from a voltage source 44 serve as a load of the demodulator. The transistors 29 to 32 make up a current output type amplifier. A demodulated signal is applied to the bases of the transistors 31 and 32. These transistors 21, 22, and 29 to 32 cooperate to form a current attenuating circuit. This circuit reduces a current flowing into the smoothing capacitor 40, while keeping the information contained in the current intact. A test was conducted in which a current fed by the current source 42 was approximately 1 $\mu$A, and a current fed from the current source 41 to the demodulator was approximately 500 $\mu$A. The results of the test showed that the frequency characteristic of the detector circuit was good. Thus, the detector circuit according to the present invention can obtain a desired filter time constant even if the capacitance of the smoothing capacitor is small, e.g., 30 pF.

Figure 3:
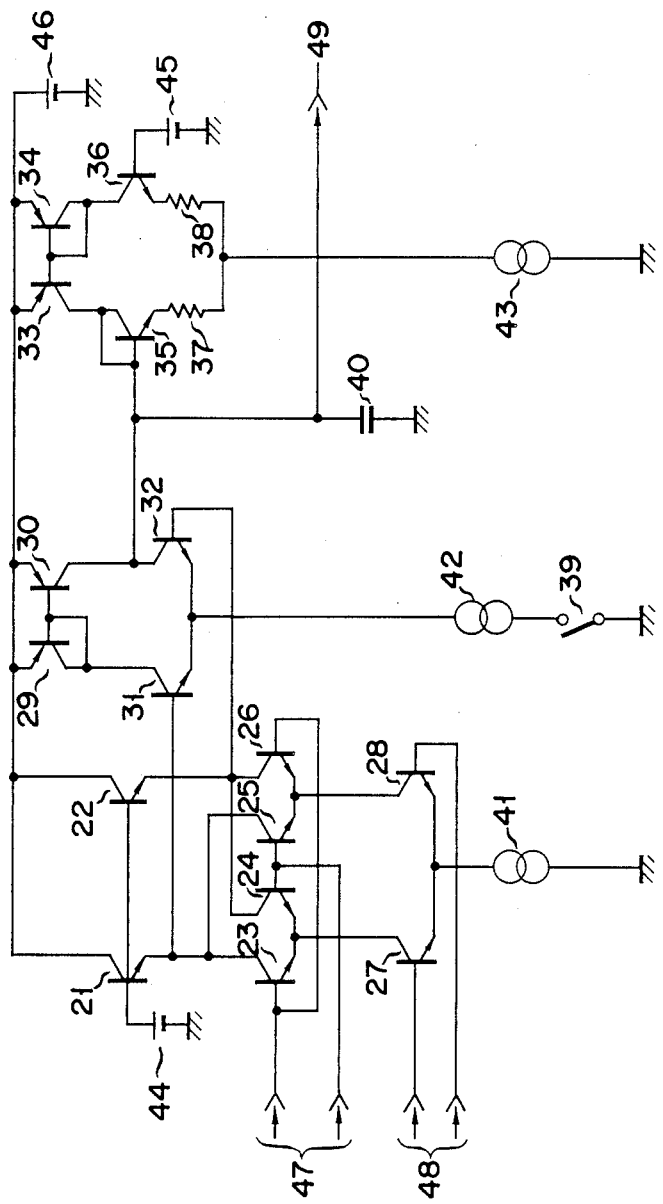
FIG. 3 is a circuit diagram of a detector circuit with a bias circuit, which incorporates the present invention.

Turning now to FIG. 3, there is shown another detector circuit according to the present invention. In the circuit, transistors 33 to 36, resistors 37 and 38, and a voltage source 45 cooperate to form a bias circuit determining a stationary voltage outputted from the detector circuit. A current source 43 feeds an operating current of the bias circuit.

The bias circuit is not essential to the present invention.

An output current of the current source 43 is set to be substantially equal to or smaller than that of the current source 42. The resistors 37 and 38 are coupled with the emitters of the transistors 35 and 36, respectively. The result is to increase an output impedance of the bias circuit and hence to little influence the time constant of the filter. A switch 39 is a switching means which closes only when the detector circuit is operated.

As seen from the foregoing description, a current attenuating circuit is inserted between a demodulator and a smoothing capacitor. The current attenuating circuit reduces the demodulated current while keeping the information contained therein intact. The circuit allows a mutual conductance of the circuit to be extremely small, even if an operating circuit of the demodulator is satisfactorily small. Accordingly, because of the relation T=C/gm, a desired filter time constant can be obtained even if the smoothing capacitor of a small capacitance is used. The detector circuit thus operable is free from the degradation of the frequency characteristic due to the reduced operation current of the demodulator.

What is claimed is:

1. A detector circuit comprising:
   demodulating means for demodulating an input signal in accordance with a carrier wave applied to said demodulating means;
   current attenuating means coupled with said demodulating means and for attenuating a signal from said demodulating means while keeping the information contained in the signal intact; and
   capacitor means, coupled with the output of said current attenuating means, for smoothing a waveform of an output signal of said current attenuating means.

2. A detector circuit according to claim 1, wherein said detector circuit constitutes a part of an integrated circuit.

3. A detector circuit according to claim 1, wherein said current attenuating means includes a current output type amplifier means for amplifying the signal.

4. A detector circuit according to claim 1, wherein said current attenuating means contains a switching means, connected to a ground point, for connecting and disconnecting between said current attenuating means and the ground point.

5. A detector circuit according to claim 1, wherein said current attenuating means includes
   a first power source;
   a first transistor having a base connected to said first power source, an emitter connected to a first output node of said demodulating means, and a collector;
   a second transistor having a base connected to said first power source, an emitter connected to a second output node of said demodulating means, and a collector connected to the collector of said first transistor;
   a third transistor having an emitter connected to the collector of said second transistor, a base, and a collector connected to said base;
   a fourth transistor having an emitter connected to the emitter of said third transistor, a base connected to the base of said third transistor, and a collector;
   a fifth transistor having a base connected to a first output node of said demodulating means, a collector connected to the collector of said third transistor, and an emitter; and
   a sixth transistor having a collector connected to the collector of said fourth transistor, a base connected to a second output node of said demodulating means, and an emitter connected to the emitter of said fifth transistor.

6. A detector circuit according to claim 1, further comprising a bias means for keeping a voltage of output of said demodulating means at a predetermined voltage.

7. A detector circuit according to claim 6, wherein said bias means includes:
   a first transistor having an emitter connected to a first output node of said current attenuating means, a collector connected to a second output node of said current attenuating means, and a base;
   a second transistor having an emitter connected to the emitter of said first transistor, a base connected to the base of said first transistor, and a collector connected to said base;
   a third transistor having a collector connected to the second output node of said current attenuating means, a base connected to the collector of third transistor, and an emitter connected to a current source means for providing current to the emitter; and
   a fourth transistor having a collector of the base of said first transistor, an emitter connected to said current source means, and a base connected to a second power source.

8. A detector circuit according to claim 6, wherein said detector circuit constitutes a part of an integrated circuit.

9. A detector circuit according to claim 6, wherein said current attenuating means includes a current output type amplifier means for amplifying the signal from said demodulating means.

10. A detector circuit according to claim 6, wherein said current attenuating means contains a switching means, connected to a ground point, for connecting and disconnecting between said current attenuating means and the ground point.

11. A detector circuit according to claim 6, wherein said current attenuating means includes:
    a first power source;
    a first transistor having a base connected to said first power source, an emitter connected to a first output node of said demodulating means, and a collector;
    a second transistor having a base connected to said first power source, an emitter connected to a second output node of said demodulating means, and a collector connected to the collector of said first transistor;
    a third transistor having an emitter connected to the collector of said second transistor, a base, and a collector connected to said base;
    a fourth transistor having an emitter connected to the emitter of said third transistor, a base connected to the base of said third transistor, and a collector;
    a fifth transistor having a base connected to a first output node of said demodulating means, a collector connected to the collector of said third transistor, and an emitter; and
    a sixth transistor having a collector connected to the collector of said fourth transistor, a base connected to a second output node of said demodulating means, and an emitter connected to the emitter of said fifth transistor.

12. A detector circuit according to claim 6, wherein said bias means includes resistors means for controlling a current of said bias means.

* * * * *